(12) United States Patent
Yang

(10) Patent No.: US 7,960,292 B2
(45) Date of Patent: Jun. 14, 2011

(54) METHOD OF FABRICATING ZINC OXIDE FILM HAVING MATCHING CRYSTAL ORIENTATION TO SILICON SUBSTRATE

(75) Inventor: Tsun-Neng Yang, Taipei (TW)

(73) Assignee: Atomic Energy Council-Institute of Nuclear Energy Research, Taoyuan (TW)

(*) Notice: Subject to any disclaimer, the term of this patent is extended or adjusted under 35 U.S.C. 154(b) by 285 days.

(21) Appl. No.: 12/434,638

(22) Filed: May 2, 2009

(65) Prior Publication Data

US 2010/0279461 A1 Nov. 4, 2010

(51) Int. Cl.
*H01L 21/20* (2006.01)
*H01L 21/205* (2006.01)

(52) U.S. Cl. .......... 438/763; 438/758; 438/104; 438/44; 257/E21.09; 257/E21.097

(58) Field of Classification Search .............. 438/44, 438/222, 226, 241, 269, 363, 384, 388, 413, 438/416, 429, 442, 607, 903, 969, 37, 41, 46, 47, 84–87, 93–95, 102–105, 478–509, 647

See application file for complete search history.

(56) References Cited

U.S. PATENT DOCUMENTS

| | | | |
|---|---|---|---|
| 7,601,558 B2 * | 10/2009 | Li et al. | 438/87 |
| 2009/0062128 A1 * | 3/2009 | Harada et al. | 505/238 |
| 2009/0224240 A1 * | 9/2009 | Shinagawa et al. | 257/43 |

* cited by examiner

*Primary Examiner* — N Drew Richards
*Assistant Examiner* — Mamadou Diallo
(74) *Attorney, Agent, or Firm* — Jackson IPG PLLC; Demian K. Jackson

(57) ABSTRACT

A zinc oxide (ZnO) film is fabricated. Metal-organic chemical vapor deposition (MOCVD) is used to obtain the film with few defects, high integrity and low cost through an easy procedure. The ZnO film above a silicon substrate has a matching crystal orientation to the substrate. Thus, the ZnO film is fit for ultraviolet light-emitting diodes (UV LED), solar cells and related laser devices.

13 Claims, 9 Drawing Sheets

METHOD OF FABRICATING ZINC OXIDE FILM HAVING MATCHING CRYSTAL ORIENTATION TO SILICON SUBSTRATE

FIELD OF THE INVENTION

The present invention relates to fabricating a ZnO film; more particularly relates to fabricating a high-quality ZnO film having a matching crystal orientation to a silicon substrate, which is fit for ultraviolet light-emitting diodes (UV LED) solar cells and laser devices.

DESCRIPTION OF THE RELATED ARTS

ZnO thin film has good quality, low defect density, high quantum effect and low cost compatible with mass production equipments. Therein, ZnO thin film has a bandgap width about 3.37 electron volt (eV) and may produces UV spectrum about 380 nanometers. Thus, ZnO thin film is fit for UV LEDs, solar cells and laser devices for further generating visible light coordinated with various phosphor powders.

Various ZnO thin films may have the following structures: (a) ZnO/Si structure: ZnO is directly deposited on a silicon substrate after epitaxy. (b) ZnO/AlN/$Al_2O_3$ structure: AlN is firstly coated on an $Al_2O_3$ substrate; then, ZnO is deposited on it after epitaxy. (c) ZnO/GaN/$Al_2O_3$ structure GaN is firstly coated on an $Al_2O_3$ substrate; then, ZnO is deposited on it after epitaxy. (d) ZnO/GaAs structure: ZnO is directly deposited on a GaAs substrate after epitaxy.

However, the above ZnO thin film is expansive with many defects. Hence, the prior arts do not fulfill all users' requests on actual use.

SUMMARY OF THE INVENTION

The main purpose of the present invention is to fabricate a high-quality ZnO film with few defects, high quality, easy producing and low cost, which has a matching crystal orientation to a silicon substrate and is fit for ultraviolet light-emitting diodes (LED), solar cells and laser devices.

To achieve the above purpose, the present invention is a method of fabricating a ZnO film having a matching crystal orientation to a silicon substrate, comprising steps of: (a) obtaining a silicon substrate having a (111) crystal orientation, filling in a carrier gas and running a thermal etching process on the silicon substrate by using HCl gas; (b) filling in a carrier gas, transferring a III-group feedstock gas having Al and a V-group feedstock gas having $N_2$ onto the silicon substrate, and obtaining an AlN thin layer after a high temperature epitaxy through metal-organic chemical vapor deposition (MOCVD) to form a multi-layered thin film of AlN/Si(111); (c) filling in a carrier gas, transferring a III-group feedstock gas having Al and Ga and a V-group feedstock gas having $N_2$ onto the AlN/Si(111) thin film, and obtaining an AlGaN thin layer after a high temperature epitaxy through MOCVD to form a multi-layered AlGaN/AlN/Si(111) thin film; (d) filling in a carrier gas, transferring a III-group feedstock gas having Ga and a V-group feedstock gas having $N_2$ onto the AlGaN/AlN/Si(111) thin film, and obtaining a GaN thin layer after a high temperature epitaxy through MOCVD to form a multi-layered GaN/AlGaN/AlN/Si(111) thin film; (e) filling in a carrier gas, transferring a III-group feedstock gas having In and Ga and a V-group feedstock gas having $N_2$ onto the GaN/AlGaN/AlN/Si(111) thin film, and obtaining an $In_xGa_{1-x}$N thin layer after a high temperature epitaxy through MOCVD to form a multi-layered $In_xGa_{1-x}$N/GaN/AlGaN/AlN/Si(111) thin film; (f) filling in a carrier gas, transferring chemical-reaction feedstock gases onto the $In_xGa_{1-x}$N/GaN/AlGaN/AlN/Si(111) thin film, and obtaining a LT-ZnO thin layer after an epitaxy through MOCVD at a temperature between 150° C. and 200° C. to form a multi-layered LT-ZnO/$In_xGa_{1-x}$N/GaN/AlGaN/AlN/Si(111) thin film; (g) putting the LT-ZnO/$In_xGa_{1-x}$N/GaN/AlGaN/AlN/Si(111) thin film into a furnace to run a thermal treatment at a high temperature with a carrier gas; and (h) filling in a carrier gas, transferring chemical-reaction feedstock gases onto the LT-ZnO/$In_xGa_{1-x}$N/GaN/AlGaN/AlN/Si(111) thin film, and obtaining a HT-ZnO thin layer after an epitaxy through MOCVD at a temperature between 600° C. and 650° C. to obtain a multi-layered HT-ZnO/LT-ZnO/$In_xGa_{1-x}$N/GaN/AlGaN/AlN/Si(111) thin film. Accordingly, a novel method of fabricating a ZnO film having a matching crystal orientation to a silicon substrate is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
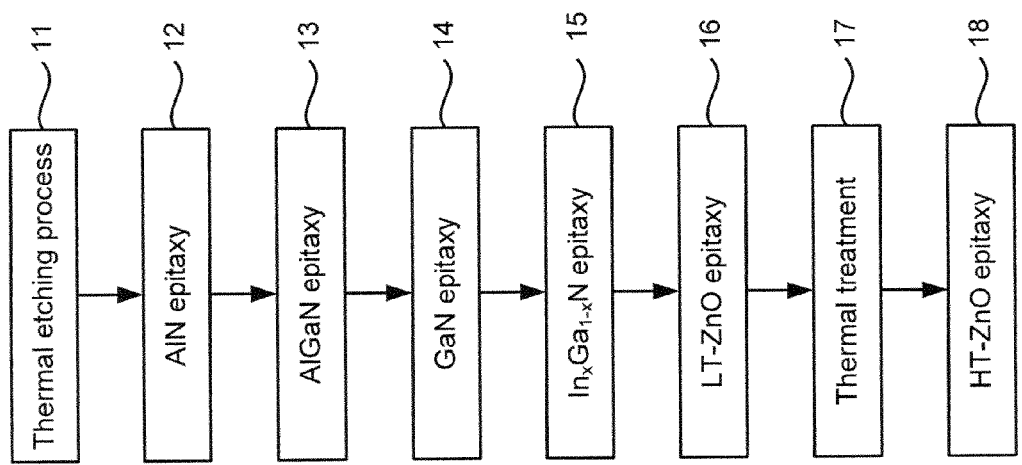
FIG. 1 is the flow view showing the preferred embodiment according to the present invention.
Figure 2:
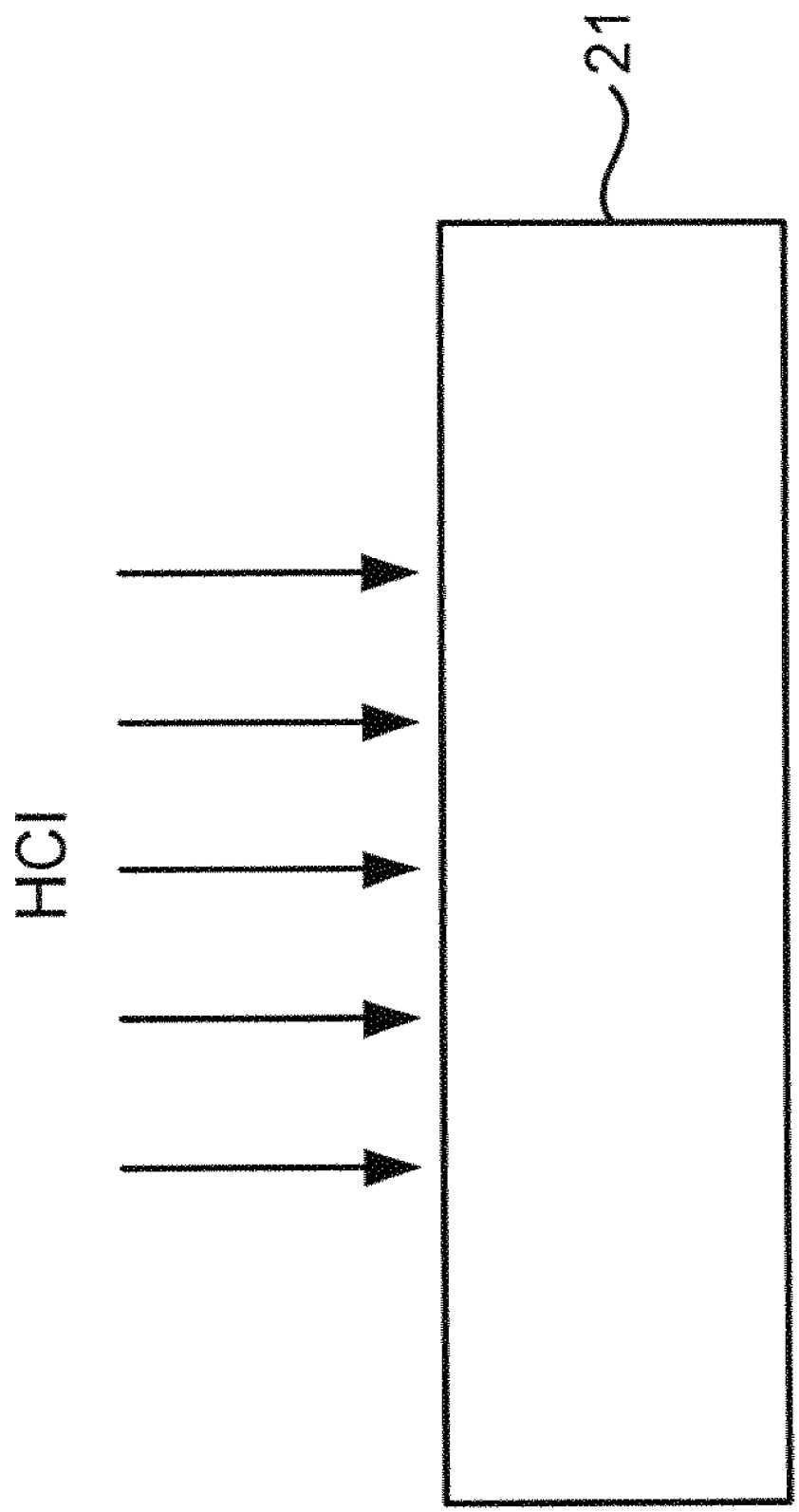
FIG. 2 until FIG. 9 are the sectional views showing the structures during fabrication.
Figure 9:
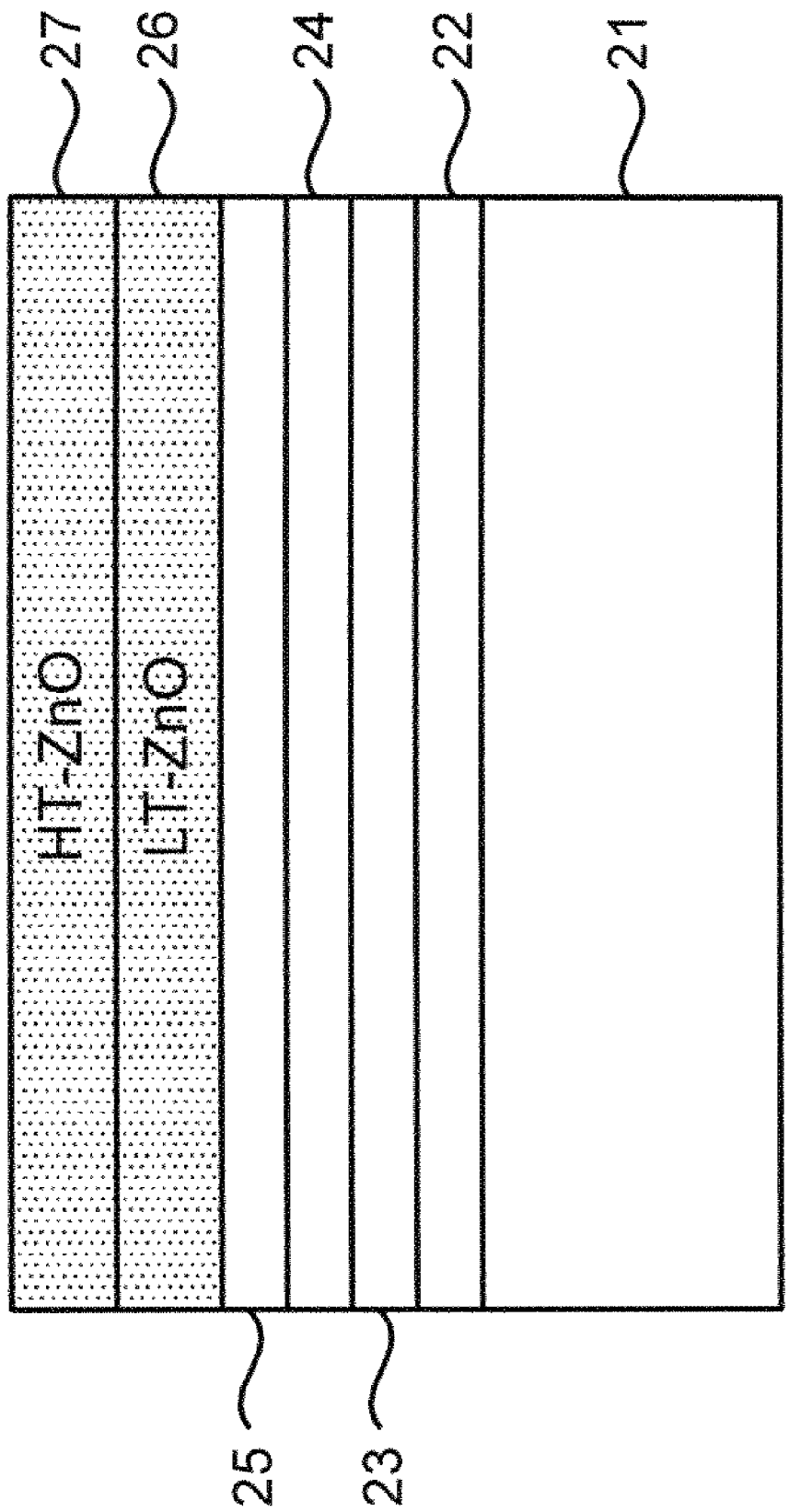

Please refer to FIG. 1 until FIG. 9, which are a flow view showing a preferred embodiment according to the present invention; and sectional views showing structures during fabrication. As shown in the figures, the present invention is a method of fabricating a ZnO film having a matching crystal orientation to a silicon substrate, comprising steps of:

(a) Thermal etching process 11: In FIG. 2, a silicon substrate 21 having a (111) crystal orientation is selected with a carrier gas filled in for a thermal etching process at a high temperature with a HCl gas used.

Figure 3:
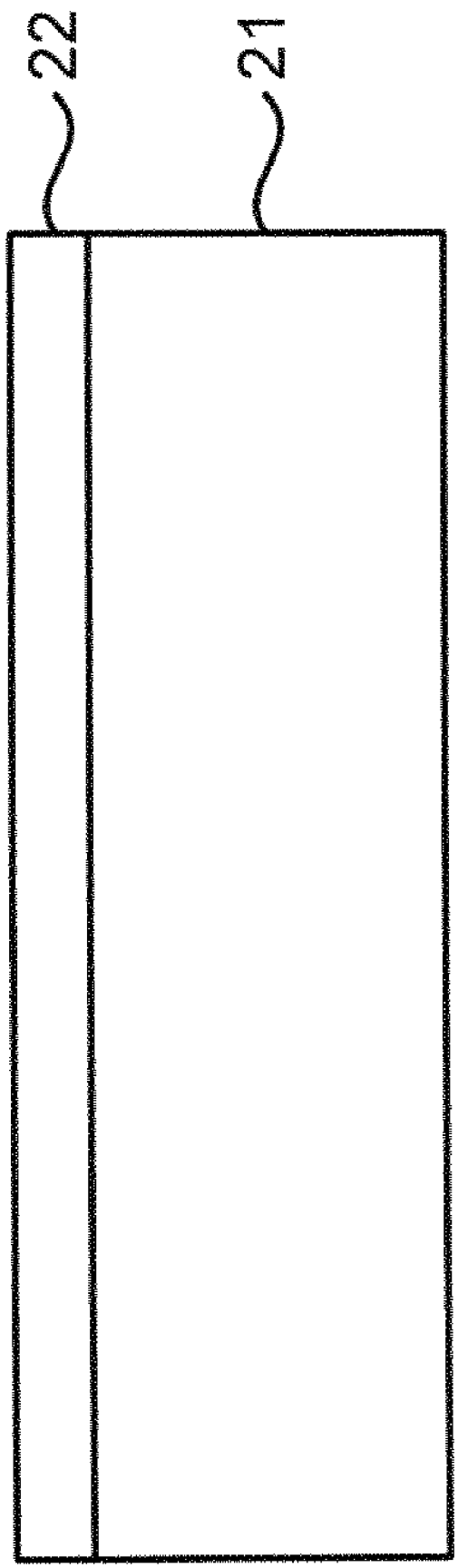

(b) AlN epitaxy 12: In FIG. 3, a carrier gas is filled in A III-group feedstock gas having Al and a V-group feedstock gas having $N_2$ are transferred onto the silicon substrate 21 obtained after the thermal etching process. Then an AlN thin layer 22 is formed after a high temperature epitaxy through metal-organic chemical vapor deposition (MOCVD) to form a multi-layered thin film of AlN/Si(111)

Figure 4:
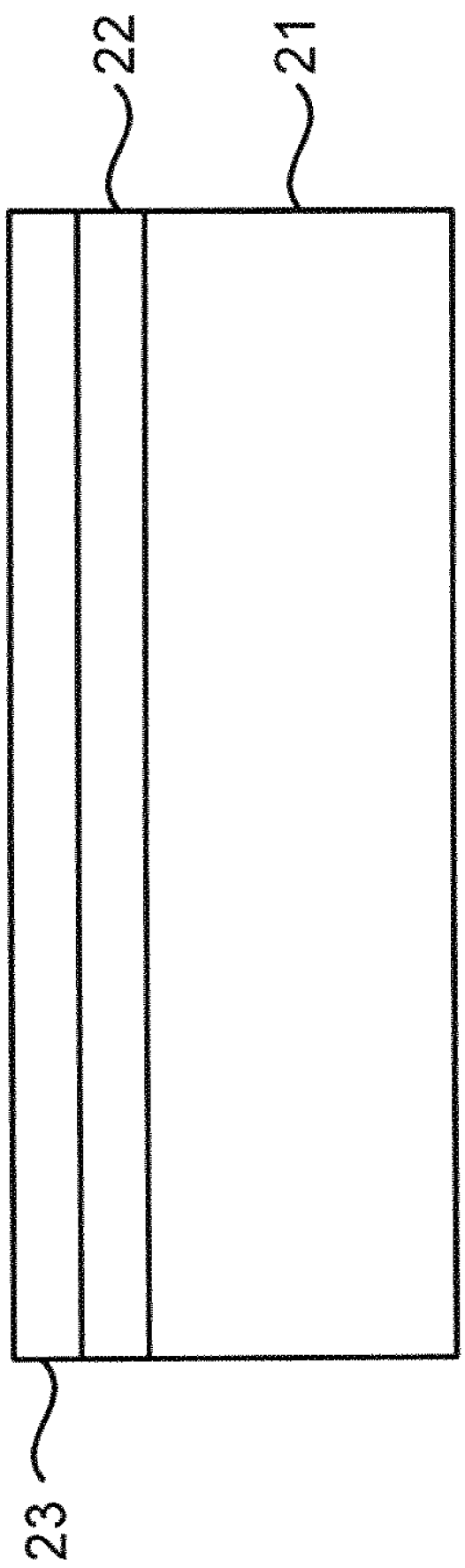

(c) AlGaN epitaxy 13: In FIG. 4, a carrier gas is filled in. A III-group feedstock gas having Al and Ga and a V-group feedstock gas having $N_2$ are transferred onto the AlN/Si(111) thin film. Then, an AlGaN thin layer 23 is formed after a high temperature epitaxy through MOCVD to form a multi-layered thin film of AlGaN/AlN/Si(111).

Figure 5:
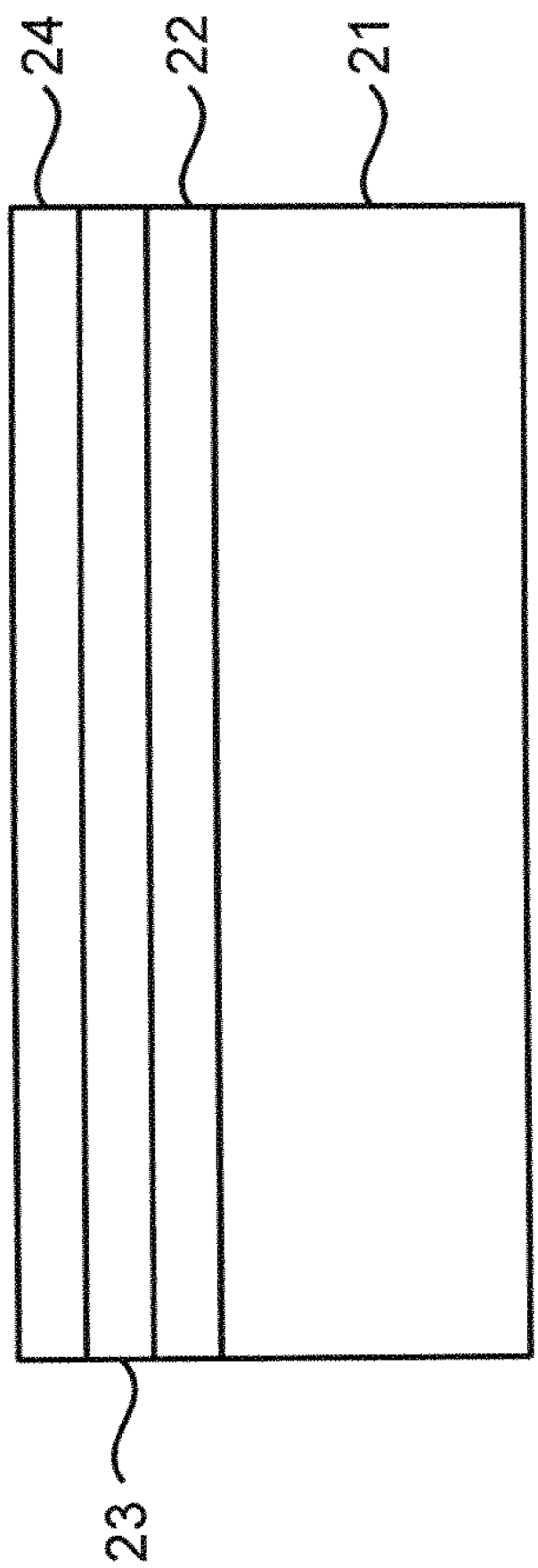

(d) GaN epitaxy 14: In FIG. 5, a carrier gas is filled in. A III-group feedstock gas having Ga and a V-group feedstock gas having $N_2$ are transferred onto the AlGaN/AlN/Si(111) thin film. Then, a GaN thin layer 24 is formed after a high temperature epitaxy through MOCVD to form a multi-layered thin film of GaN/AlGaN/AlN/Si(111).

Figure 6:
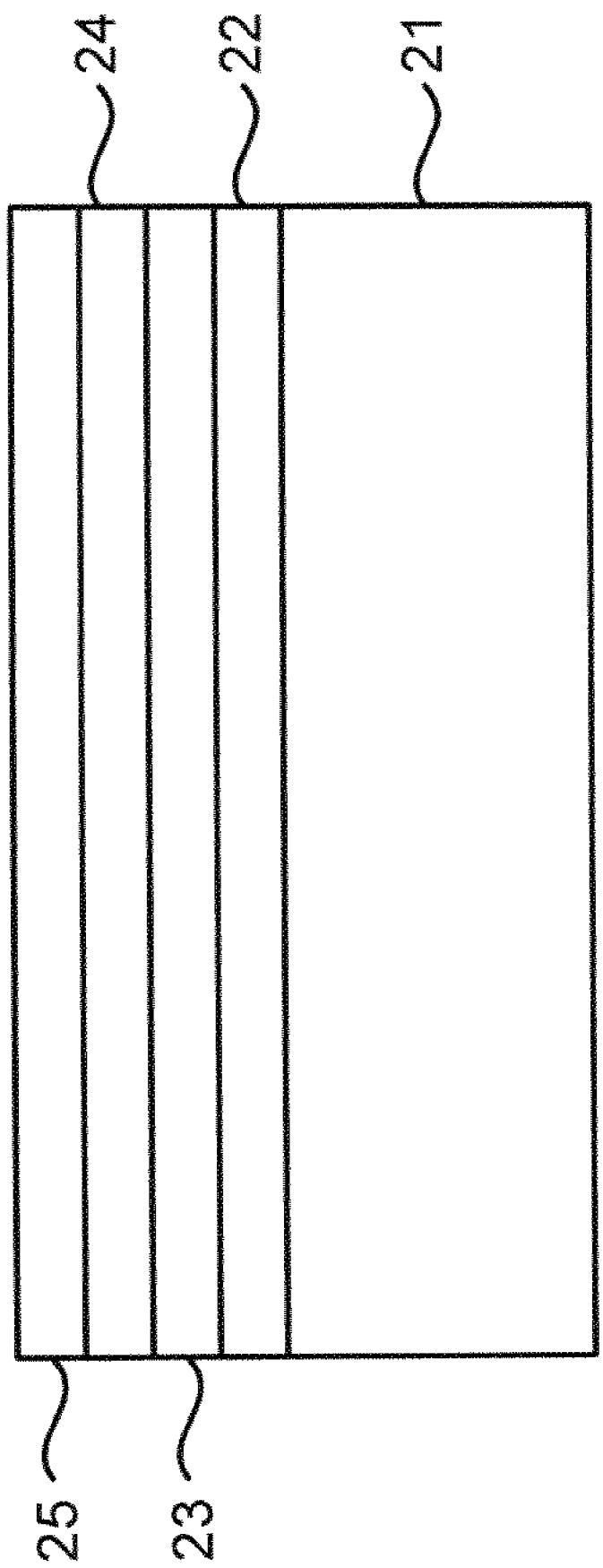

(e) $In_xGa_{1-x}$N epitaxy 15: In FIG. 6, a carrier gas is filled in. A III-group feed stock gas having In and Ga and a V-group feedstock gas having $N_2$ are transferred onto the GaN/AlGaN/AlN/Si(111) thin film. Then, an $In_xGa_{1-x}$N thin layer 25 is formed after a high temperature epitaxy through MOCVD to form a multi-layered thin film of $In_xGa_{1-x}N$/GaN/AlGaN/AlN/Si(111).

Figure 7:
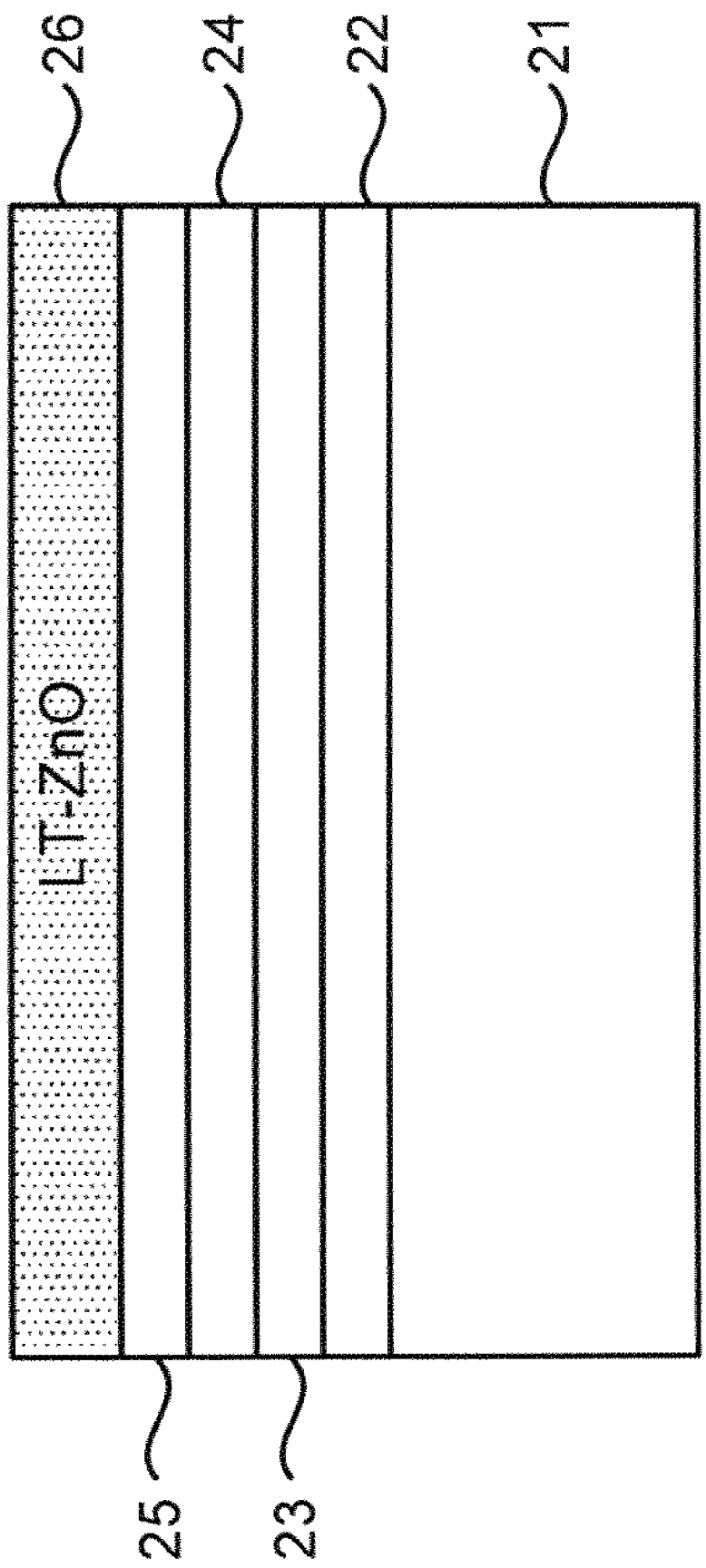

(f) LT-ZnO epitaxy 15: In FIG. 7, a carrier gas is filled in. Chemical-reaction feedstock gases are transferred onto the $In_xGa_{1-x}N$/GaN/AlGaN/AlN/Si(111) thin film. Then, a LT-ZnO thin layer 26 is formed after an epitaxy through MOCVD at a temperature between 150° C. and 200° C. to form a multi-layered then film of LT-ZnO/$In_xGa_{1-x}N$/GaN/AlGaN/AlN/Si(111).

Figure 8:
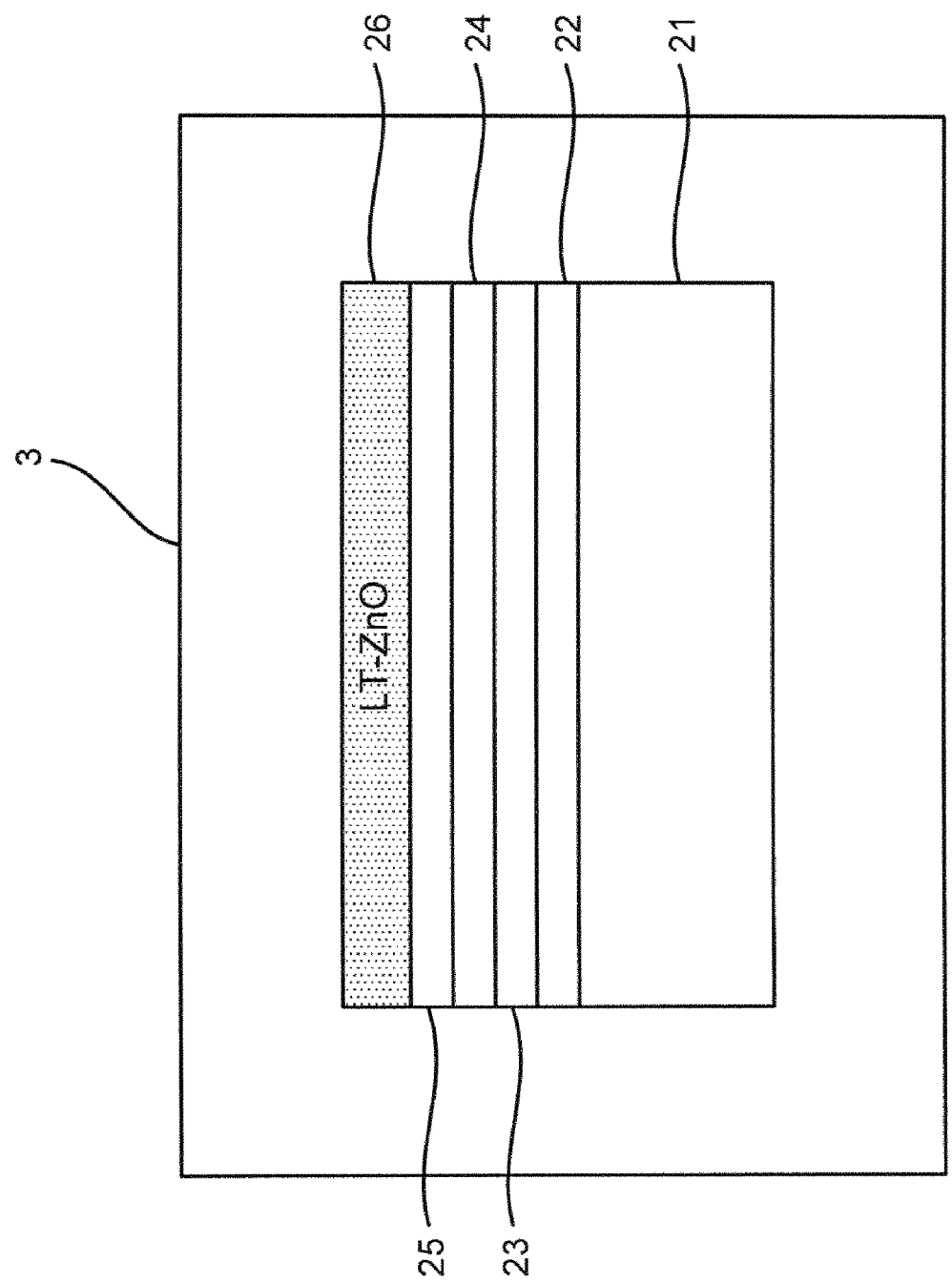

(g) Thermal treatment 17: In FIG. 8, the LT-ZnO/$In_xGa_{1-x}N$/GaN/AlGaN/AlN/Si(1111) thin film is put into a furnace 3 to run a thermal treatment at a high temperature with a carrier gas.

(h) HT-ZnO epitaxy 18: In FIG. 9, a carrier gas is filled in. Chemical-reaction feed stock gases are transferred onto the LT-ZnO/$In_xGa_{1-x}N$/GaN/AlGaN/AlN/Si(111) thin film obtained after the thermal treatment. Then, a HT-ZnO thin layer 27 is formed after an epitaxy through MOCVD at a temperature between 600° C. and 650° C. to form a multi-layered thin film of HT-ZnO/LT-ZnO/$In_xGa_{1-x}N$/GaN/AlGaN/AlN/Si(111).

Therein, layers of HT-ZnO/LT-ZnO 26,27 formed through epitaxies at low and high temperatures obtain a matching single-crystal lattice to the silicon substrate 21. Thus, a novel method of fabricating a ZnO film having a matching crystal orientation to a silicon substrate is obtained.

On using the present invention, a silicon substrate 12 having a (111) crystal orientation is selected at first. $H_2$ is filled in as a carrier gas. A HCl gas is transferred to a reaction chamber for a thermal etching process for 5 minutes (m in) at 1150° C. Then, with the same carrier gas, MOCVD is used for epitaxy to sequentially form an AlN thin layer 22, an AlGaN thin layer 23, a GaN thin layer 24 and an $In_xGa_{1-x}N$ thin layer 25 at 1100° C. on the silicon substrate obtained after the thermal etching process. Thus, a multi-layered thin film of $In_xGa_{1-x}N$/GaN/AlGaN/AlN/Si(111) is obtained. Therein, x in $In_xGa_{1-x}N$ is a value between 17% and 18% for perfectly matching crystal lattice of latter ZnO layers to the silicon substrate 21. Hence, the layers of $In_xGa_{1-x}N$/GaN/AlGaN/AlN are first buffer layers for matching crystal lattice.

Then, a low temperature ZnO epitaxy is processed. $N_2$ is filled in as a carrier gas. Di-ethylzinc (DEZ) and $H_2O$, $O_2$ or $N_2O$ are used as chemical-reaction feedstock gases for an epitaxy through MOCVD at a low temperature between 150° C. and 200° C. for a period between 5 min and 10 min to form a LT-ZnO thin layer 26 on the $In_xGa_{1-x}N$/GaN/AlGaN/AlN/Si(111) thin film. Thus, a LT-ZnO/$In_xGa_{1-x}N$/GaN/AlGaN/AlN/Si(111) thin film is obtained. Therein, the LT-ZnO thin layer 26 is a second buffer layer for matching crystal lattice to latter ZnO thin layer.

Then, the LT-ZnO/$In_xGa_{1-x}N$/GaN/AlGaN/AlN/Si (111) thin film is put into a high temperature furnace 3. $N_2$ is filled in as a carrier gas. A thermal treatment is processed at a temperature between 700° C. and 800° C.

At last, a high temperature ZnO epitaxy is processed. The same chemical-reaction feedstock gases as those used in low temperature ZnO epitaxy are filled in for an epitaxy through MOCVD at a high temperature between 600° C. and 650° C. for a period between 10 min and 30 min to form a HT-ZnO thin layer 27 on the LT-ZnO/$In_xGa_{1-x}N$/GaN/AlGaN/AlN/Si (111) thin film. Thus, a HT-ZnO/LT-ZnO/$In_xGa_{1-x}N$/GaN/AlGaN/AlN/Si(111) thin film is obtained.

In this way, the present invention uses MOCVD for epitaxies to obtain the ZnO/$In_xGa_{1-x}N$/GaN/AlGaN/AlN thin film on the silicon substrate (Si (111)) 21. The ZnO layers 26,27 formed at low and high temperatures have a single-crystal structure. Therein, the $In_xGa_{1-x}N$/GaN/AlGaN/AlN layers are interface layers or buffer layers; and, thus, the ZnO layers 26,27 have crystal lattice fully matched to that of the silicon substrate 21. Hence, a high-quality ZnO thin film is obtained with few defects, high quality, easy producing and low cost, which is fit for ultraviolet light-emitting diodes (UV LED), solar cells and laser devices.

To sum up, the present invention is a method of fabricating a ZnO film having a matching crystal orientation to a silicon substrate, where MOCVD is used for epitaxies to obtain a multi-layered thin film on a silicon substrate with few defects, high quality, easy producing and low cost; ZnO layers in the thin film have a crystal lattice fully matched to the silicon substrate; and the ZnO layers have a single-crystal structure fit for UV LEDs, solar cells and laser devices.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a ZnO film having a matching crystal orientation to a silicon substrate, comprising steps of:
   (a) obtaining a silicon substrate having a (111) crystal orientation, filling in a carrier gas, and running a thermal etching process on said silicon substrate by using a HCl gas;
   (b) filling in a carrier gas, transferring a III-group feedstock gas having Al and a V-group feedstock gas having nitrogen $N_2$ onto said silicon substrate obtained after said thermal etching process, and obtaining an AlN thin layer after a high temperature epitaxy through metal-organic chemical vapor deposition (MOCVD) to obtain a multi-layered thin film of AlN/Si(111);
   (c) filling in a carrier gas, transferring a III-group feedstock gas having Al and Ga and a V-group feed stock gas having $N_2$ onto said AlN/Si(111) thin film, and obtaining an AlGaN thin layer after a high temperature epitaxy through MOCVD to obtain a multi-layered thin film of AlGaN/AlN/Si(111);
   (d) filling in a carrier gas, transferring a III-group feedstock gas having Ga and a V-group feedstock gas having $N_2$ onto said AlGaN/AlN/Si(111) thin film, and obtaining a GaN thin layer after a high temperature epitaxy through MOCVD to obtain a multi-layered thin film of GaN/AlGaN/AlN/Si(111);
   (e) filling in a carrier gas, transferring a III-group feedstock gas having In and Ga and a V-group feedstock gas having $N_2$ onto said GaN/AlGaN/AlN/Si(111) thin film, and obtaining an $In_xGa_{1-x}N$ thin layer after a high temperature epitaxy through MOCVD to obtain a multi-layered thin film of $In_xGa_{1-x}N$/GaN/AlGaN/AlN/Si(111);
   (f) filling in a carrier gas, transferring chemical-reaction feedstock gases onto said $In_xGa_{1-x}N$/GaN/AlGaN/AlN/Si(111) thin film, and obtaining a LT-ZnO thin layer after an epitaxy through MOCVD at a temperature between 150° C. and 200° C. to obtain a multi-layered thin film of LT-ZnO/$In_xGa_{1-x}N$/GaN/AlGaN/AlN/Si (111);
   (g) putting said LT-ZnO/$In_xGa_{1-x}N$/GaN/AlGaN/AlN/Si (111) thin film into a furnace to run a thermal treatment at a high temperature with a carrier gas; and
   (h) filling in a carrier gas, transferring chemical-reaction feedstock gases onto said LT-ZnO/$In_xGa_{1-x}N$/GaN/Al- GaN/AlN/Si(111) thin film obtained after said thermal treatment, and obtaining a HT-ZnO thin layer after an epitaxy through MOCVD at a temperature between 600° C. and 650° C. to obtain a multi-layered thin film of HT-ZnO/LT-ZnO/In$_x$Ga$_{1-x}$N/GaN/AlGaN/AlN/Si (111), Wherein, through said epitaxies at high and low temperatures, layers of HT-ZnO/LT-ZnO obtain a matching single-crystal lattice to said silicon substrate.

2. The method according to claim 1,
Wherein, in step (a) said thermal etching process is processed at 1150° C.

3. The method according to claim 1,
wherein, in step (a), said thermal etching process is processed for 5 minutes (min).

4. The method according to claim 1,
wherein, in step (a) until step (e), said carrier gases are H$_2$.

5. The method according to claim 1
wherein, in step (a) until step (e), said epitaxies are processed at 1100° C.

6. The method according to claim 1
wherein, in step (e), said x in said In$_x$Ga$_{1-x}$N is a ratio between 17% and 18%.

7. The method according to claim 1
wherein, in step (e), layers of In$_x$Ga$_{1-x}$N/GaN/AlGaN/AlN are first buffer layers to match crystal lattice.

8. The method according to claim 1,
wherein, in step (f), said epitaxy is processed for a period between 5 min and 10 min.

9. The method according to claim 1
wherein, in step (f), said LT-ZnO thin layer is a second buffer layer to match crystal lattice.

10. The method according to claim 1,
wherein, in step (g), said thermal treatment is processed at a temperature between 700° C. and 800° C.

11. The method according to claim 1,
wherein, in step (h), said epitaxy is processed for a period between 10 min and 30 min.

12. The method according to claim 1,
wherein, in step (f) and step (h), said chemical-reaction feedstock gases comprises di-ethylzinc (DEZ) and a compound selected from a group consisting of H$_2$O, O$_2$ and N$_2$O.

13. The method according to claim 1,
wherein, in step (f) until step (h), said carrier gases are N$_2$.

* * * * *